US008420538B2

(12) United States Patent
Yamada et al.

(10) Patent No.: US 8,420,538 B2
(45) Date of Patent: Apr. 16, 2013

(54) LIQUID FOR PROTECTING COPPER WIRING SURFACE AND METHOD FOR MANUFACTURING SEMICONDUCTOR CIRCUIT ELEMENT

(75) Inventors: Kenji Yamada, Tokyo (JP); Kenji Shimada, Tokyo (JP); Hiroshi Matsunaga, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 155 days.

(21) Appl. No.: 13/062,365

(22) PCT Filed: Sep. 2, 2009

(86) PCT No.: PCT/JP2009/065319
§ 371 (c)(1),
(2), (4) Date: May 19, 2011

(87) PCT Pub. No.: WO2010/026981
PCT Pub. Date: Mar. 11, 2010

(65) Prior Publication Data
US 2011/0212617 A1 Sep. 1, 2011

(30) Foreign Application Priority Data

Sep. 8, 2008 (JP) ................................. 2008-229866
Oct. 2, 2008 (JP) ................................. 2008-257200

(51) Int. Cl.
*H01L 21/302* (2006.01)
*H01L 21/44* (2006.01)
*C23F 11/00* (2006.01)
*C09K 15/00* (2006.01)

(52) U.S. Cl.
USPC ............ 438/692; 438/687; 252/387; 252/397

(58) Field of Classification Search ........................ None
See application file for complete search history.

(56) References Cited

FOREIGN PATENT DOCUMENTS

| CN | 1860256 A | 11/2006 |
|---|---|---|
| JP | 2002 164315 | 6/2002 |

OTHER PUBLICATIONS

U.S. Appl. No. 13/119,539, filed Mar. 17, 2011, Yamada, et al.
Chinese Office Action issued May 31, 2012 in patent application No. 200980135121.4.
F.B. Growcock, et al., "The Inhibition of Steel Corrosion in Hydrochloric Acid with 3-Phenyl-2-Propyn-1-ol", Corrosion Science, vol. 28, No. 4, 1988, pp. 397-410.
International Search Report issued Oct. 6, 2009 in PCT/JP09/65319 filed Sep. 2, 2009.

*Primary Examiner* — Scott B Geyer
(74) *Attorney, Agent, or Firm* — Oblon, Spivak, McClelland, Maier & Neustadt, L.L.P.

(57) ABSTRACT

A copper wiring material surface protective liquid is provided that is used in production of a semiconductor circuit device containing copper wiring, and consists of an aqueous solvent and an acetylene alcohol compound containing at least 3-phenyl-2-propyn-1-ol. A method for producing a semiconductor circuit device is provided that contains: forming an insulating film and/or a diffusion preventing film on a silicon substrate; then forming a copper film by a sputtering; then forming a copper film or a copper alloy film containing 80% by mass or more of copper thereon by a plating method; and flattening the film by a chemical mechanical polishing (CMP) method, thereby providing a semiconductor substrate containing a flattened copper wiring, in which the semiconductor substrate having an exposed surface of a copper wiring material is treated by making in contact with the copper wiring material surface protective liquid.

9 Claims, No Drawings

LIQUID FOR PROTECTING COPPER WIRING SURFACE AND METHOD FOR MANUFACTURING SEMICONDUCTOR CIRCUIT ELEMENT

TECHNICAL FIELD

The present invention relates to a copper wiring surface protective liquid for protecting a copper wiring surface from contamination, corrosion, oxidation and occurrence of foreign matters, which are derived from the production process of a semiconductor circuit device and the environment, thereby providing a clean copper wiring surface, and to a method for producing a semiconductor circuit using the same.

BACKGROUND ART

A lithography method has been generally employed as a production method of a semiconductor circuit device. In the case where a semiconductor circuit device is produced by the lithography method, a conductor thin film layer, such as a metal film, used as a conductor wiring material, and an interlayer insulating film, such as a silicon oxide film, for insulating among the conductor thin film layers and the wiring are formed on a semiconductor substrate, such as a silicon wafer. Thereafter, a photoresist is coated uniformly on the surface thereof to provide a photosensitive layer, which is then subjected to selective exposure and development, thereby forming a desired resist pattern. The thin films in the lower layer part are subjected to a selective etching treatment with the resist pattern as a mask, thereby forming a desired wiring pattern on the thin films, and then the resist pattern used as a mask is removed, whereby the semiconductor circuit device is produced.

The increase in integration degree of a semiconductor circuit device requires miniaturization in dimensions of patterning process. Associated thereto, a dry etching method using etching gas is becoming mainstream for the aforementioned selective etching treatment. An alloy containing aluminum as a major component, which has been used as the circuit wiring and the electrode material, has a resistance that is too high for the wiring material of the highly integrated semiconductor circuit device, and there may be problems, such as decrease in response speed due to wiring delay, increase in generated heat amount, and electromigration due to increase in electric current density. For solving the problems, a wiring material using copper or an alloy containing 80% by mass or more of copper (which will be hereinafter referred to as a copper wiring material), which has a small electric resistance and is excellent in migration characteristics as compared to the alloy containing aluminum as a major component, is being widely developed and employed.

However, there are problems that copper useful as a wiring material is difficult to be subjected to the selective etching by the dry etching method using etching gas, and upon making in contact with an insulating material, such as an interlayer insulating film, copper in a copper wiring material is diffused into the insulating material, thereby impairing the insulating property thereof. Furthermore, the copper wiring material is liable to be oxidized to form an oxide on the surface thereof, and is liable to be corroded in an aqueous solution on wet etching, rinsing or the like, and thus the copper wiring material is necessarily handled with care.

In the case where copper or a copper alloy containing 80% by mass or more of copper is used as a wiring material, it is necessary to use a wiring formation technique that does not employ a dry etching method using etching gas. Accordingly, a wiring formation technique referred to as a damascene method is employed, in which a trench in the form of the wiring is formed in an interlayer insulating film, in which a metal, such as a copper wiring material, is filled therein.

For preventing diffusion of copper in the copper wiring material into the insulating material, which lowers the insulating property thereof, a procedure is necessarily employed in that the copper wiring is covered with a film that prevents copper from being diffused (which will be hereinafter referred to as a diffusion preventing film). The diffusion preventing film is disposed between the copper wiring material and the insulating material in view of the function thereof. Examples of the formation method therefor employed include a method, in which an insulating material, such as an interlayer insulating film, having been formed into a desired shape is covered with a diffusion preventing film, which is generally referred to as a barrier layer or a barrier metal, formed by a film formation method, such as a sputtering method and a CVD method (a chemical vapor deposition method), and then a copper wiring material is formed thereon, and a method, in which a copper wiring material is formed on a semiconductor substrate by a plating method, and then flattened by a chemical mechanical polishing method (which will be hereinafter referred to as a CMP method) for removing an excessive copper wiring material and flattening the surface of the copper wiring, and then the copper wiring is covered with a diffusion preventing film, which is generally referred to as a cap layer, i.e., a cap metal, formed by a sputtering method, a CVD method or the like. In any of these methods, the diffusion preventing film is formed and is in contact with the surface of the copper wiring material. The copper wiring material that is to be covered with the diffusion preventing film, which is referred to as a barrier layer, a barrier metal, a cap layer or a cap metal, is in an exposed state before covering with the diffusion preventing film. The copper in the exposed state is easily oxidized with oxygen in the air, and an oxide layer is formed on the surface of the copper wiring material before covering with the diffusion preventing film. While depending on the waiting time until the step of forming the diffusion preventing film, the exposed surface of the copper wiring material may be considerably oxidized to form foreign matters, or may suffer formation of contamination, corrosion and foreign matters derived from the production environment. Upon limiting the waiting time until the step of forming the diffusion preventing film for avoiding the problems, disadvantages on productivity and economy may occur due to complicated procedures.

Specific examples of the step where the surface of the copper wiring material is exposed include a wiring formation step by the damascene method, in which an interlayer insulating film or a diffusion preventing film is etched to form a trench in the form of the wiring, and a copper wiring material is then filled in the trench. Examples of the cases where the surface of the copper wiring material is exposed in the step include the following cases (1) and (2).

(1) The surface of the lower layer copper wiring material is exposed in the step, in which an interlayer insulating film or a diffusion preventing film (a cap metal) is etched to reach the copper wiring material as the lower layer for achieving electric conduction.

(2) After forming by a plating method a diffusion preventing film (a barrier metal) or a copper wiring material in the trench in the form of the wiring formed in the case (1), the surface of the copper wiring material is exposed in the step of flattening by a CMP method.

The cases (1) and (2) include a cleaning step with a cleaning liquid, a rinsing step with extra pure water and a drying step, and in these steps, changes and modifications of the state of the surface of the copper wiring material, i.e., oxidation and corrosion of the surface of the copper wiring material, may occur.

Specifically, in the case where a dry etching process is used in the step of etching the interlayer insulating film for forming the trench in the form of the wiring, i.e., the case (1), a residue derived from the dry etching gas, the resist, the film to be processed, the materials of the members inside the dry etching chamber, and the like (which will be hereinafter referred to as an etching residue) is formed. The etching residue existing is not preferred since it causes such phenomena as an increased resistance, an electric short circuit, and the like. For removing the etching residue, in general, there is such a process that the surface is cleaned with a cleaning liquid, and immediately after cleaning, the cleaning liquid is rinsed out with an organic solvent or extra pure water. In the case where the cleaning liquid exhibits alkalinity, it may be rinsed with carbonated water for neutralizing the alkalinity. In the case of a cleaning step by a spin spraying method achieved with a single substrate cleaning device or the like, the rinsing step may be performed with carbonated water instead of extra pure water for preventing static charge of the semiconductor substrate.

In the process where a copper wiring material is formed by a plating method, and then the surface thereof is flattened by CMP, i.e., the case (2), the surface of the copper wiring material formed by a plating method is polished with a slurry containing polishing particles, such as cerium oxide, and a polishing pad (i.e., the CMP process) for providing the desired thickness, flatness and wiring pattern, and then excessive copper thus ground, the polishing particles remaining on the surface of the copper wiring material thus polished, and the like are removed by cleaning. The cleaning process includes a rinsing step with extra pure water or carbonated water. Not only carbonated water, but also extra pure water in this case easily exhibit weak acidity through absorption of carbon dioxide in the air. The rinsing with the weakly acidic water easily corrodes the surface of the copper wiring material. In the drying step after rinsing, such methods are employed as a method of spinning the semiconductor substrate for draining water and drying, blowing air onto the spinning semiconductor substrate for draining water and drying, and a method of drying the substrate with hot air or steam, but there are cases where the surface of the copper wiring material is oxidized or modified in the drying step depending on the drying method. Even when the surface of the copper wiring material can be prevented from being oxidized or modified in the drying step, the surface of the copper wiring material is exposed until the subsequent step of forming a diffusion preventing film, and may be easily oxidized with oxygen in the air, thereby forming an oxide layer on the surface of the copper wiring material. The surface of the copper wiring material may be considerably oxidized to form foreign matters, or may suffer formation of contamination, corrosion and foreign matters derived from the production environment.

The copper wiring material thus modified through corrosion or oxidation is not desirable since it may cause increase in electric resistance, decrease in adhesion to the diffusion preventing film, occurrence of voids, and the like. With the progress of miniaturization in recent years, slight modification, e.g., minute corrosion, minute increase in thickness of the oxide film, and minute foreign matters, that has been permitted may cause great influence on the performance of the semiconductor device, which brings about a significant problem of defective products. For avoiding the problem of defective products, it is important to maintain clean the surface state of copper or a copper alloy containing 80% by mass or more of copper, which will be a wiring material.

In the case involving the problem of modification, such as oxidation, corrosion and foreign matters, on the surface of the copper wiring material in the cleaning step as described above, a metal modification preventing method has been known that a deoxidizing agent removing dissolved oxygen, a corrosion preventing agent, a passive film forming agent or the like is used in the water rinsing step. It has been also known in the drying step that a vacuum drying method or a drying method performed in a nitrogen atmosphere is employed for preventing modification on the surface of copper. While examples of the deoxidizing agent used for removing dissolved oxygen in the water rinsing step include a reducing agent, such as hydrazine, hydroxylamine, sodium sulfite and a sodium bisulfite, the deoxidizing agent can prevent the surface of the copper wiring material from being oxidized or modified in water upon rinsing with water, but fails to prevent completely the surface of the copper wiring material from being oxidized or modified upon drying and, after drying. Furthermore, oxidation or modification on the surface of the copper wiring material is difficult to be avoided by employing a vacuum drying method or a drying method performed in a nitrogen atmosphere in the drying step unless the surface of the copper wiring material is not exposed, and moreover, a vacuum drying method and a drying method performed in a nitrogen atmosphere require high cost for equipments with low workability and are disadvantageous in cost due to nitrogen used in a large amount.

As a copper surface protective film, Patent Documents 1 to 3 disclose a pre-drying treating liquid containing acetylene alcohol with a hydroxylamine compound, a hydrazine compound or an alkylalcohol, and disclose that a metal surface free of unevenness and stain (discoloration) is obtained by suppressing oxidation in a drying step. However, some kinds of metals are easily oxidized, and problems may occur in prevention of corrosion on rinsing with pure water exhibiting weak acidity used in a production process of a semiconductor circuit device, and a surface of a copper wiring material exposed during a waiting time from a drying step to a subsequent step.

Patent Documents 4 to 6 propose the use of an acetylene alcohol compound, an acetylene diol compound, and ethylene oxide or propylene oxide thereof mixed in an organic acid, and a developer liquid, a separating liquid, a cleaning liquid and a rinsing liquid therefor, or a CMP slurry used in a production process of a semiconductor. However, they cannot prevent occurrence of contamination, corrosion and foreign matters derived from the production environment, formed on the surface of the copper wiring material in the production process of a semiconductor circuit device or the like.

Furthermore, for preventing failure of a semiconductor device caused by oxidation or modification of an exposed copper surface, there is a method for suppressing oxidation or modification of the copper surface by preventing the metal from being in contact with the air (e.g., oxygen) with a modification preventing agent or an anticorrosion agent attached to the copper surface. Patent Document 4 discloses as conventional art the use of benzotriazole (which will be hereinafter abbreviated as BTA) as an anticorrosion agent for copper in a photoresist separating liquid used in a production process of a semiconductor circuit device containing copper wiring. The use of an amine compound or a triazole compound, such as BTA, forms a complex compound of the compound with copper on the surface of copper, thereby failing to provide a clean copper surface. The anticorrosion agent present on the copper surface is not desirable since it may cause increase in electric resistance, decrease in adhesion to the diffusion preventing film, occurrence of voids, and the like, as similar to modified copper. A triazole compound or the like with low solubility in water is not desirable since the compound remains on the wafer surface even after rinsing with water and is difficult to be removed, thereby providing adverse affect on the subsequent process. Moreover, a triazole compound, such as BTA, is poor in biodegradability and thus provide a large load on waste liquid processing.

As described hereinabove, it is significantly important that for producing a highly integrated and highly miniaturized semiconductor circuit device with high accuracy and high quality, it is important to form a diffusion preventing film while maintaining a clean surface of a copper wiring material. Accordingly such a technique is demanded that in production of a semiconductor circuit device, a surface of a copper wiring material is protected from modification, such as corrosion and oxidation, and contamination derived from the production environment, thereby maintaining the surface clean during the period of from a step of exposing the surface of the copper wiring material, e.g., a step of forming a trench in the form of wiring reaching the lower layer copper wiring material in an interlayer insulating film to expose the surface of the copper wiring material, and a step of flattening by CMP a surface of copper or a copper alloy formed by a plating method to expose the surface of the copper wiring material, to a step of forming a diffusion preventing film.

RELATED ART DOCUMENTS

Patent Documents
Patent Document 1: JP-A-09-302325
Patent Document 2: JP-A-10-8278
Patent Document 3: JP-A-2002-164315
Patent Document 4: JP-A-2000-162788
Patent Document 5: JP-A-2005-109452
Patent Document 6: JP-A-2006-251491

SUMMARY OF THE INVENTION

Problems to be Solved by the Invention

An object of the present invention is to provide such a copper wiring material surface protective liquid that in production of a semiconductor circuit device, a surface of a copper wiring material is protected from modification, such as corrosion, oxidation and occurrence of foreign matters, and contamination derived from the production environment, which occur during the steps of cleaning, rinsing with water and drying the exposed surface of the copper wiring material, and during a waiting time between the steps, immediately before a step of covering the copper wiring material with a diffusion preventing film, thereby providing a clean surface of the copper wiring material, and a method for producing a semiconductor circuit using the same.

Means for Solving the Problems

As a result of earnest investigations made by the inventors, it has been found that the use of an aqueous solution containing an acetylene alcohol compound containing at least 3-phenyl-2-propyn-1-ol as a copper wiring material surface protective liquid effectively protects a surface of a copper wiring material from modification, such as corrosion, oxidation and occurrence of foreign matters, and contamination derived from the production environment, and the subsequent step, such as heating and/or depressurizing, provides a clean surface of the copper wiring material without the acetylene alcohol compound including 3-phenyl-2-propyn-1-ol attached to the surface of the copper wiring material, and thus the present invention has been completed.

The present invention provides the following.

(1) A copper wiring material surface protective liquid used in production of a semiconductor circuit device containing copper wiring, consisting of an aqueous solvent and an acetylene alcohol compound containing at least 3-phenyl-2-propyn-1-ol.

(2) The copper wiring material surface protective liquid according to the item (1), wherein the acetylene alcohol compound is 3-phenyl-2-propyn-1-ol, and the protective liquid contains the same in an amount of from 0.01 to 0.25% by mass.

(3) The copper wiring material surface protective liquid according to the item (2), wherein the protective liquid contains 3-phenyl-2-propyn-1-ol in an amount of from 0.03 to 0.25% by mass.

(4) The copper wiring material surface protective liquid according to the item (1), wherein the acetylene alcohol compound contains two or more kinds of compounds including 3-phenyl-2-propyn-1-ol, and the protective liquid contains 3-phenyl-2-propyn-1-ol in an amount of from 0.001 to 0.03% by mass.

(5) The copper wiring material surface protective liquid according to the item (4), wherein the at least one kind of the acetylene alcohol compound other than 3-phenyl-2-propyn-1-ol is an acetylene alcohol having from 3 to 10 carbon atoms.

(6) The copper wiring material surface protective liquid according to the item (4), wherein the at least one kind of the acetylene alcohol compound other than 3-phenyl-2-propyn-1-ol is a polyoxyalkylene compound of an acetylenediol.

(7) The copper wiring material surface protective liquid according to the item (6), wherein the acetylenediol is 2,4,7,9-tetramethyl-5-decyn-4,7-diol or 2,5,8,11-tetramethyl-6-dodecyn-5,8-diol.

(8) The copper wiring material surface protective liquid according to the item (4), wherein a concentration of the acetylene alcohol compound other than 3-phenyl-2-propyn-1-ol is from 0.001 to 10% by mass.

(9) A method for producing a semiconductor circuit device, containing: forming an insulating film and/or a diffusion preventing film on a silicon substrate; then forming a copper film by a sputtering; then forming a copper film or a copper alloy film containing 80% by mass or more of copper thereon by a plating method; and flattening the film by a chemical mechanical polishing (CMP) method, thereby providing a semiconductor substrate containing a flattened copper wiring, the semiconductor substrate having an exposed surface of a copper wiring material being treated by making in contact with the copper wiring material surface protective liquid according to the item (1).

According to the present invention, such a copper wiring material surface protective liquid is provided that in production of a semiconductor circuit device, a surface of a copper wiring material is protected from modification, such as corrosion, oxidation and occurrence of foreign matters, and contamination derived from the production environment, which occur during the steps of cleaning, rinsing with water and drying the exposed surface of the copper wiring material, and during a waiting time between the steps, immediately before a step of covering the copper wiring material with a diffusion preventing film, thereby providing a clean surface of the copper wiring material, and a method for producing a semiconductor circuit device using the same is also provided.

EMBODIMENTS FOR CARRYING OUT THE INVENTION

1. Copper Wiring Material Surface Protective Liquid

The copper wiring material surface protective liquid of the present invention is used in production of a semiconductor circuit device containing copper wiring, and consists of an aqueous solvent and an acetylene alcohol compound containing at least 3-phenyl-2-propyn-1-ol. The "aqueous solvent" referred herein means water (pure water) and a mixed solvent of water with an organic solvent described later, such as an alcohol compound, a glycol ether compound, an amide compound and a dimethylsulfoxide compound.

In the present invention, an exposed surface of a copper wiring material in production of a semiconductor circuit device is treated by making in contact with the copper wiring material surface protective liquid of the present invention (contact treatment) before rinsing with water, rinsing with carbonated water and making the surface in contact with the air or the production environment, which cause modification, such as corrosion and oxidation, on the exposed surface of the copper wiring material.

It is considered that according to the liquid contact treatment, the exposed surface of the copper wiring material adsorbs mainly 3-phenyl-2-propyn-1-ol chemically or physically. It is considered that the presence of the adsorbed component protects the surface of the copper wiring material from the factors causing the modification, such as corrosion and oxidation. The adsorbed component can be easily removed by a predetermined treatment, and therefore, by removing the adsorbed component immediately before the step of covering the copper wiring material with a diffusion preventing film, the diffusion preventing film can be formed on a clean surface of the copper wiring material without modification or the like.

Examples of the occasions where the copper wiring material surface protective liquid of the present invention is used in a production process of a semiconductor circuit device include the following. The protective liquid may be used, for example:

(1) after forming a copper wiring material on semiconductor substrate by a plating method, (2) after polishing the surface of the copper wiring material for providing the desired thickness, flatness and wiring pattern of the copper wiring material by CMP with a CMP slurry containing polishing particles, such as cerium oxide, aluminum oxide and silicon oxide, and a polishing pad, (3) after cleaning by removing excessive copper ground by CMP, the polishing particles remaining on the polished surface of the copper wiring material, and the like, and (4) in a wiring formation process by a damascene method, after forming a trench in the form of the wiring for embedding a copper wiring material in an interlayer insulating film as an insulating film material, for example, by a dry etching method, and cleaning with a cleaning liquid to remove an etching residue formed on etching.

In each of the cases, preceding the drying, rinsing with water or rinsing with carbonated water, the semiconductor substrate having an exposed surface of the copper wiring material is treated by making in contact with the copper wiring material surface protective liquid of the present invention, followed by drying. According to the procedures, 3-phenyl-2-propyn-1-ol is mainly adsorbed on the surface of the copper wiring material as an adsorbed component, which protects the surface of the copper wiring material from modification, such as corrosion, oxidation and foreign matters, and contamination derived from the production environment, not only during the process steps but also after drying, and is conveniently removed from the surface of the copper wiring material by depressurizing, heating or the like in the subsequent formation of a diffusion preventing film, thereby providing a clean surface of the copper wiring material.

A step of rinsing with water or rinsing with carbonated water may be provided after the liquid contact treatment.

The concentration of 3-phenyl-2-propyn-1-ol in the case where no other acetylene alcohol compound is used in combination, i.e., in the case where it is used solely, is preferably from 0.01 to 0.25% by mass, more preferably from 0.03 to 0.25% by mass, and further preferably from 0.05 to 0.15% by mass, in consideration of reduction in liquid contact treatment time, handleability of the protective liquid, and economy. The sole use thereof is preferred since a mixing step can be omitted.

In the case where 3-phenyl-2-propyn-1-ol is used in combination with another acetylene alcohol compound, 3-phenyl-2-propyn-1-ol is preferably from 0.001 to 0.03% by mass, more preferably from 0.005 to 0.03% by mass, and further preferably from 0.01 to 0.025% by mass, in consideration of economy and reduction in treatment time. The combination use is economically advantageous since the amount of 3-phenyl-2-propyn-1-ol used as the active ingredient can be decreased.

At least one kind of the acetylene alcohol compound other than 3-phenyl-2-propyn-1-ol is preferably an acetylene alcohol having from 3 to 10 carbon atoms or a polyoxyalkylene compound of an acetylenediol.

The acetylene alcohol having from 3 to 10 carbon atoms is preferred from the standpoint of solubility with water. The polyoxyalkylene compound of an acetylenediol is also preferred from the standpoint of solubility with water.

Preferred examples of the acetylene alcohol having from 3 to 10 carbon atoms used include at least one kind selected from 2,5-dimethyl-3-hexyn-2,5-diol, 3,5-dimethyl-1-hexyn-3-ol, 1-octyn-3-ol, 1-ethynyl-1-cyclohexanol, 2-methyl-3-butyn-2-ol, 4-methyl-1-pentyn-3-ol, 4-pentyn-1-ol, 4-pentyn-2-ol, 3-methyl-1-pentyn-3-ol, 2-propyn-1-ol, 2-butyn-1,4-diol, 4-ethyl-1-octyn-3-ol, ethynylbenzene, 3,3-dimethyl-1-butyne, 2-butyn-1-ol and 3-hexyn-2,5-diol. Particularly preferred examples among these include 2,5-dimethyl-3-hexyn-2,5-diol, 3,5-dimethyl-1-hexyn-3-ol, 1-octyn-3-ol, 1-ethynyl-1-cyclohexanol, 2-methyl-3-butyn-2-ol, 4-methyl-1-pentyn-3-ol, 4-pentyn-1-ol, 4-pentyn-2-ol and 3-methyl-1-pentyn-3-ol.

The acetylenediol of the polyoxyalkylene compound may be 2,4,7,9-tetramethyl-5-decyn-4,7-diol and/or 2,5,8,11-tetramethyl-6-dodecyn-5,8-diol, and preferred examples of the polyoxyalkylene compound used include a 1 to 20 mol adduct of ethylene oxide or propylene oxide.

The concentration of the acetylene alcohol compound other than 3-phenyl-2-propyn-1-ol (which is the total concentration in the case where plural kinds thereof are used) is preferably from 0.001 to 10% by mass, and more preferably from 0.01 to 2% by mass, in consideration of handleability, economy; effect of the copper wiring material surface protective liquid and the like.

As the treatment apparatus and the treating method for performing the liquid contact treatment with the copper wiring material surface protective liquid of the present invention, a treatment apparatus and a treating method that are used for producing a semiconductor circuit device may be used. For example, a batch process using an immersion type treatment apparatus, a spin spraying type treatment apparatus where the aqueous solution is sprinkled on a rotating semiconductor substrate, and a single substrate treatment apparatus may be used.

Examples of the case where the liquid contact treatment is performed by using an immersion type treatment apparatus include a method, in which a semiconductor substrate having an exposed surface of a copper wiring material is immersed in a liquid contact treatment bath having the copper wiring material surface protective liquid of the present invention housed therein, and after lapsing a predetermined period of time, the substrate is taken out from the liquid contact treatment bath and then immersed in a rinsing bath, followed by drying. The copper wiring material surface protective liquid housed in the liquid contact treatment bath may be fed from the bottom part of the bath and recycled through overflow from the upper part of the bath, may be subjected to the liquid contact treatment in storing the protective liquid in the liquid contact treatment bath without recycling, may be subjected to a multi-stage liquid contact treatment, may be subjected to the liquid contact treatment with the semiconductor substrate vibrated, or may be subjected to the treatment under application of ultrasonic wave, and these cases may be selected appropriately.

The rinsing bath may also be operated by an overflow system, a multi-stage liquid contact treatment, a quick dump system where the rinsing water is repeatedly accumulated and withdrawn, or a system where the rinsing water is fed by spraying from the upper part of the bath, and these cases may be selected appropriately.

As a method for drying the semiconductor substrate having been subjected to the liquid contact treatment, a method of draining the rinsing water by rotation, a method of drying with hot air, or a method of using an organic solvent with good drying property, such as isopropyl alcohol, may be selected appropriately.

Examples of the case where a spin spraying type apparatus is used include a method, in which the copper wiring material surface protective liquid of the present invention or the rinsing water is fed and sprayed onto the semiconductor substrate disposed substantially vertically under rotation. Examples of the drying method include a method, in which the semiconductor substrate is rotated at a high speed to drain the liquid, and a method, in which heated nitrogen or air may be fed to the chamber.

Examples of the treatment using the single substrate treatment apparatus include a method, in which a semiconductor substrate disposed horizontally is subjected to cleaning with a cleaning liquid, a CMP treatment or other treatments, and the copper wiring material surface protective liquid of the present invention is fed to the rotating semiconductor substrate from the above, a method, in which the feeding nozzles for feeding the copper wiring material surface protective liquid of the present invention in the former case are disposed not only at the center of the semiconductor substrate but also at a position deviated from the center, a method of feeding the protective liquid from the feeding nozzles moving on the semiconductor substrate, a method of feeding the copper wiring material surface protective liquid of the present invention while changing the rotation number of the semiconductor substrate, and a method of accumulating the cleaning liquid or the rinsing water on the semiconductor substrate by stopping the rotation of the semiconductor substrate. The rinsing treatment may be performed by a method of feeding the rinsing water, such as extra pure water to the rotating semiconductor substrate from the above, and the aforementioned methods may be similarly employed. Examples of the drying method include a method of draining the liquid by rotating the semiconductor substrate at a high speed, and a method of blowing off the liquid by feeding nitrogen or the air to the semiconductor substrate. The rotation number of the semiconductor substrate, the amount of the liquid fed, and recycled use or one-time use of the copper wiring material surface protective liquid of the present invention in these treatments may be appropriately determined depending on the specification of the treatment apparatus used.

The liquid contact treatment time with the copper wiring material surface protective liquid of the present invention is not particularly limited and may be appropriately determined depending on the liquid contact treatment apparatus and the liquid contact treating method. The liquid contact treatment time is practically preferably from 5 to 1,000 seconds, more preferably from 5 to 900 seconds, and further preferably from 5 to 600 seconds. When the treatment time is 5 seconds or more, the effect of the liquid contact treatment can be obtained sufficiently. The treatment time is suitably 1,000 seconds or less from the standpoint of productivity and economy.

For example, in the case of the batch liquid contact treatment using an immersion type liquid contact treatment apparatus or a spin spraying liquid contact treatment apparatus, it is necessary to set the liquid contact treatment time at approximately 600 seconds from the standpoint that plural semiconductor substrates may be subjected to the liquid contact treatment in one liquid contact treatment bath, and the standpoint of operability of the liquid contact treatment apparatus.

In the case using the single substrate liquid contact treatment apparatus, it is necessary to set the liquid contact treatment time at from 5 to 120 seconds from the standpoint that semiconductor substrates are subjected one by one to the liquid contact treatment in one liquid contact treatment bath, and the standpoint that the liquid contact treatment time can be managed by second in this treatment system.

The liquid contact treatment temperatures, such as the temperature of the aqueous solution and the temperature of the semiconductor substrate in the liquid contact treatment, and the liquid contact treatment atmosphere are not particularly limited, and the temperature is preferably from 5 to 50° C., more preferably from 10 to 40° C., and further preferably from 15 to 30° C., from the standpoint of prevention of oxidation and modification of the surface of the copper wiring material. The liquid contact treatment atmosphere is preferably such an atmosphere that makes the liquid contact treatment to be performed under a state without oxygen causing oxidation of the surface of the copper wiring material, such as a nitrogen atmosphere, which may be appropriately determined in consideration of productivity, economy and the specification of the liquid contact treatment apparatus used.

The copper wiring material surface protective liquid preferably satisfies the following conditions. The temperature, at which the adsorbed component is desorbed after the liquid contact treatment, is preferably from 40 to 400° C., more preferably from 80 to 300° C., and further preferably from 100 to 250° C. When the temperature is 40° C. or more, the protection effect with the copper wiring material surface protective liquid can be maintained to the sufficient state, and when the temperature is 400° C. or less, the semiconductor circuit device can be prevented from suffering damages.

The pressure, at which the component in the copper wiring material surface protective liquid of the present invention is desorbed from the surface of the copper wiring material, may be an ordinary pressure or a reduced pressure and may be determined depending on the treating method and the treatment apparatus without particular limitation. The reduced pressure is preferably high vacuum of $1 \times 10^{-5}$ Pa or less.

When the reduced pressure is employed, there are cases where high cost is required for equipments of the treatment apparatus.

The pressure is practically preferably from an ordinary pressure to $1\times10^{-8}$ Pa, more preferably from an ordinary pressure to $1\times10^{-7}$ Pa, and further preferably from an ordinary pressure to $1\times10^{-5}$ Pa, while depending on the process and the specification of the apparatus used for desorbing.

The copper wiring material surface protective liquid of the present invention is preferably used as an aqueous solution, and for enhancing the drying property after the liquid contact treatment, it is effective to use an organic solvent component, such as an alcohol compound, a glycol ether compound, an amide compound and a dimethylsulfoxide compound, mixed therein. Preferred examples of the alcohol compound include an alcohol having from 1 to approximately 10 carbon atoms, and methanol, ethanol and isopropanol are particularly preferred. Preferred examples of the glycol ether include a monoalkyl ether and a dialkyl ether of ethylene glycol, diethylene glycol, triethylene glycol, propylene glycol, dipropylene glycol, tripropylene glycol and the like. Among these, a diethylene glycol monoalkyl ether, a diethylene glycol dialkyl ether, a dipropylene glycol monoalkyl ether, a dipropylene glycol dialkyl ether and the like are preferred, and preferred examples thereof specifically include diethylene glycol monomethyl ether, diethylene glycol monobutyl ether, dipropylene glycol monomethyl ether and dipropylene glycol monopropyl ether. Examples of the amide include N,N-dimethylformamide, N,N-dimethylacetamide and N-methyl-2-pyrrolidone. However, the organic solvent component is not limited to these compounds.

In addition to the above, an acid, an alkali, an organic solvent, a chelating agent, an additive and the like that are ordinarily used in an aqueous solution used in production of a semiconductor circuit device may be mixed therein depending on necessity in such a range that does not impair the advantages of the present invention.

The semiconductor circuit device to be subjected to the liquid contact treatment in the present invention has an exposed surface of a copper wiring material and may have other members therewith. Examples of the members constituting the semiconductor circuit device include a substrate material, such as silicon, amorphous silicon, polysilicon and glass, and materials accumulated thereon, for example, a wiring material; such as silicon oxide, silicon nitride, silicon carbide, tetraethoxysilane (which, will be hereinafter referred to as TEOS), titanium, titanium nitride, tantalum, tantalum nitride, ruthenium, cobalt, copper, tungsten, and derivatives and alloys thereof, and an insulating material. A compound semiconductor, such as gallium-arsenic, gallium-phosphorus and indium-phosphorus, and chromium oxide that has an exposed surface of a copper wiring material are also included.

2. Method for Producing Semiconductor Circuit Device

In the method for producing a semiconductor circuit device of the present invention, an insulating film and/or a diffusion preventing film is formed on a silicon substrate, and is formed into a desired shape through a photolithograph step, a dry etching step and a cleaning step for removing a residue formed on dry etching. A copper film is formed thereon by a sputtering method, a copper wiring containing 80% by mass or more of copper is provided thereon by a plating method, which is then flattened by a chemical mechanical polishing (CMP) method, and the substrate is subjected to a cleaning step, such as post-CMP cleaning for removing the reagent used in the CMP step, thereby forming a copper wiring, a diffusion preventing film on an insulating film, and an insulating film. Thereafter, a photolithography step, a dry etching step, a cleaning step, a copper film forming step and the like are performed repeatedly, thereby providing a semiconductor substrate having a copper wiring. In these steps and between these steps, the semiconductor substrate having an exposed surface of the copper wiring material is subjected to the liquid contact treatment with the copper wiring material surface protective liquid of the present invention.

The conditions for the liquid contact treatment have been described above. The liquid contact treatment thus performed provides a semiconductor circuit device having a clean surface of a copper wiring material.

EXAMPLE

The present invention will be described specifically with reference to examples and comparative examples below. The present invention is not limited to the examples.

Example A

Production of Substrate Sample for Evaluation

On a silicon substrate, a TEOS (tetraethoxysilane) film having a thickness of 500 nm was formed by a CVD method, and a tantalum nitride film having a thickness of 10 nm and a tantalum film having a thickness of 20 nm were each formed by a sputtering method, in this order. On the tantalum film thus formed, a copper film having a thickness of 100 nm was formed by a sputtering method, and then a plated copper film containing copper as a major component was formed by a plating method. The plated copper film was flattened by CMP to a thickness of 500 nm, thereby producing a semiconductor substrate, which was used as a substrate sample for evaluation.

The following evaluations were performed with the substrate sample for evaluation.

Evaluation 1: Evaluation of Corrosion with Carbonated Water

For evaluating the copper wiring material surface protective function, the substrate samples for evaluation were processed by the methods and conditions described in Examples and Comparative Examples, and then the substrate samples were immersed in extra pure water having carbon dioxide dissolved therein (specific resistance: 0.35 MΩ·cm, hereinafter referred to as carbonated water) at 25° C. for 5 minutes, and then dried by blowing nitrogen. The surface of the copper wiring material of the sample treated with carbonated water was observed with a high-resolution field-emission scanning electron microscope (hereinafter abbreviated as SEM). The results are shown in Table 1 below. The evaluation standard is as follows. A sample having corroded copper on the surface thereof (i.e., evaluated as B) was determined as poor protective function.

A: No corrosion observed on surface of copper wiring material

B: Corrosion observed on surface of copper wiring material

Evaluation 2: Evaluation on Exposure to High Humidity

For evaluating the modification preventing effect on the surface of the copper wiring material, the substrate samples for evaluation processed by the methods and conditions described in Examples and Comparative Examples were placed in a constant temperature and humidity chamber (IW221A, produced by Yamato Scientific Co., Ltd.) maintained at a temperature of 60° C. and a humidity of 60%, and exposed thereto for 4 hours. Thereafter, the surface of the sample was observed with SEM. The results are shown in Table 1 below. The evaluation standard is as follows. A sample having foreign matters formed on the copper surface (i.e., evaluated as B) was determined as poor modification preventing effect.

A: No foreign matter observed on surface of copper wiring material

B: Foreign matters observed on surface of copper wiring material

Evaluation 3: Evaluation of Desorption Property of Adsorbed Component

For confirming the desorption property of the adsorbed component from the surface of the copper wiring material, the substrates were subjected to overheating or heating and depressurization under the condition in Table 1, and then immersed in carbonated water at 25° C. for 5 minutes, and the surface of the copper wiring material was observed with SEM. In the case where the adsorbed component is removed from the surface of the copper wiring material by subjecting the copper film having the protective film attached thereto to heating and depressurization, corrosion is observed on the surface of the copper wiring material after treating with carbonated water. Accordingly, a preferred results is that no corrosion of copper is found in Evaluation 1 but corrosion of copper is found in Evaluation 3. The results are shown in Table 1 below. The evaluation standard is as follows.

A: Corrosion observed on most of surface of copper wiring material

B: No corrosion observed on surface of copper wiring material

Example A-1

The substrate sample far evaluation was subjected to liquid contact treatment (immersion) with a 0.1% by mass 3-phenyl-2-propyn-1-ol aqueous solution at 25° C. for 120 seconds, and then rinsed with extra pure water.

The sample having been subjected to the liquid contact treatment was evaluated for corrosion with carbonated water as Evaluation 1, and no corrosion was observed on the surface of the copper wiring material.

The sample having been subjected to the liquid contact treatment similarly was blown with nitrogen and subjected to the evaluation on exposure to high humidity as Evaluation 2, and no foreign matter was observed on the surface of the copper wiring material.

For the evaluation of desorption of the adsorbed component as Evaluation 3, the sample having been subjected to the liquid contact treatment similarly was dried by blowing nitrogen, and subjected to heat treatment at an ordinary pressure in an argon atmosphere at 200° C. for 1 minute, and then treatment with carbonated water, and was observed with SEM. Corrosion was observed on the surface of the copper wiring material, which confirmed desorption of the adsorbed component.

Example A-2

The substrate sample for evaluation was made in contact with a 1% hydrofluoric acid aqueous solution (hereinafter referred to as HF water) at 25° C. for 60 seconds for removing an oxide film on the surface of the copper wiring material, and then rinsed with extra pure water. Thereafter, the sample was dried by blowing nitrogen, and then subjected to liquid contact treatment with a 0.15% by mass 3-phenyl-2-propyn-1-ol aqueous solution at 25° C. for 90 seconds, followed by rinsing with extra pure water.

The sample was evaluated for corrosion with carbonated water as Evaluation 1, and no corrosion was observed on the surface of the copper wiring material.

The sample having been subjected to the liquid contact treatment similarly was dried by blowing nitrogen and subjected to Evaluation 2, and no foreign matter was observed on the surface of the copper wiring material.

For the evaluation of desorption of the adsorbed component as Evaluation 3, the sample having been subjected to the liquid contact treatment similarly was dried by blowing nitrogen, and subjected to heat treatment at a reduced pressure of $1\times10^{-7}$ Pa and 200° C. for 10 minutes, and then treatment with carbonated water, and was observed with SEM. Corrosion was observed on the surface of the copper wiring material, which confirmed desorption of the component.

Example A-3

The substrate sample for evaluation was made in contact with HF water at 25° C. for 60 seconds and then rinsed with extra pure water. Thereafter, without blowing nitrogen, the sample was subjected to liquid contact treatment with a 0.03% by mass 3-phenyl-2-propyn-1-ol aqueous solution at 25° C. for 600 seconds, followed by rinsing with extra pure water.

The sample was subjected to Evaluation 1, and no corrosion was observed on the surface of the copper wiring material.

The sample having been subjected to the liquid contact treatment similarly was dried by blowing nitrogen and subjected to the evaluation on exposure to high humidity as Evaluation 2, and no foreign matter was observed on the surface of the copper wiring material.

For the evaluation of desorption of the adsorbed component as Evaluation 3, the sample having been subjected to the liquid contact treatment similarly was dried by blowing nitrogen, and subjected to heat treatment at an ordinary pressure in an argon atmosphere at 200° C. for 10 minutes, and then treatment with carbonated water, and was observed with SEM. Corrosion was observed on the surface of the copper wiring material, which confirmed desorption of the adsorbed component.

Example A-4

The substrate sample for evaluation was made in contact with HF water at 25° C. for 60 seconds and then rinsed with a 0.05% by mass 3-phenyl-2-propyn-1-ol aqueous solution for rinsing out the HF water. Thereafter the sample was subjected to liquid contact treatment with a 0.05% by mass 3-phenyl-2-propyn-1-ol aqueous solution at 25° C. for 300 seconds, and rinsed with extra pure water, followed by drying by blowing nitrogen.

The sample having been subjected to the liquid contact treatment was subjected to Evaluation 1, and no corrosion was observed on the surface of the copper wiring material.

The sample having been subjected to the liquid contact treatment similarly was subjected to Evaluation 2, and no foreign matter was observed on the surface of the copper wiring material.

For the evaluation of desorption of the adsorbed component as Evaluation 3, the sample having been subjected to the liquid contact treatment similarly was subjected to heat treatment at a reduced pressure of $1\times10^{-7}$ Pa and 200° C. for 10 minutes, and then treatment with carbonated water, and was observed with SEM. Corrosion was observed on the surface of the copper wiring material, which confirmed desorption of the adsorbed component.

Example A-5

The substrate sample for evaluation was made in contact with HF water at 25° C. for 60 seconds and then rinsed with a 0.05% by mass 3-phenyl-2-propyn-1-ol aqueous solution for rinsing out the HF water. Thereafter the sample was subjected to liquid contact treatment with a 0.25% by mass 3-phenyl-2-propyn-1-ol aqueous solution at 25° C. for 5 seconds.

The sample was subjected to Evaluation 1, and no corrosion was observed on the surface of the copper wiring material.

The sample having been subjected to the liquid contact treatment similarly and then blown with nitrogen was subjected to Evaluation 2, and no foreign matter was observed on the surface of the copper wiring material.

For the evaluation of desorption of the adsorbed component as Evaluation 3, the sample having been subjected to the liquid contact treatment similarly was subjected to heat treatment at a reduced pressure of $1\times10^{-7}$ Pa and 250° C. for 5 minutes, and then treatment with carbonated water, and was observed with SEM. Corrosion was observed on the surface of the copper wiring material, which confirmed desorption of the adsorbed component.

Comparative Example A-1

The substrate sample for evaluation was subjected to Evaluation 1 and Evaluation 2 without subjecting to the treatment with HF water for removing an oxide film on the surface of the copper wiring material and the liquid contact treatment.

In the evaluation of corrosion with carbonated water as Evaluation 1, corrosion was observed on the surface of the copper wiring material. In the evaluation on exposure to high humidity as Evaluation 2, foreign matters were observed on the surface of the copper wiring material. Evaluation 3 was not performed since no effect was obtained in Evaluation 1.

Comparative Example A-2

The substrate sample for evaluation was immersed in HF water at 25° C. for 60 seconds for removing an oxide film on the surface of the copper wiring material, and rinsed with extra pure water, followed by drying by blowing nitrogen.

The sample was subjected to Evaluation 1, and corrosion was observed on the surface of the copper wiring material.

The sample having been subjected to the liquid contact treatment similarly and then dried was subjected to Evaluation 2, and foreign matters were observed on the surface of the copper wiring material. Evaluation 3 was not performed since no effect was obtained in Evaluation 1.

Example A-6

The substrate sample for evaluation was made in contact with HF water at 25° C. for 60 seconds and then rinsed with extra pure water. Thereafter the sample was subjected to liquid contact treatment with a 0.01% by mass 3-phenyl-2-propyn-1-ol aqueous solution at 25° C. for 300 seconds, and rinsed with extra pure water.

The sample was subjected to Evaluation 1, and no corrosion was observed on the surface of the copper wiring material.

The sample having been subjected to the liquid contact treatment similarly was then blown with nitrogen and subjected to Evaluation 2, and no foreign matter was observed on the surface of the copper wiring material.

For the evaluation of desorption of the adsorbed component as Evaluation 3, the sample having been subjected to the liquid contact treatment similarly was subjected to heat treatment at a reduced pressure of $1\times10^{-7}$ Pa and 200° C. for 10 minutes, and then treatment with carbonated water, and was observed with SEM. Corrosion was observed on the surface of the copper wiring material, which confirmed desorption of the adsorbed component.

Example A-7

The substrate sample for evaluation was subjected to liquid contact treatment with a 0.02% by mass 3-phenyl-2-propyn-1-ol aqueous solution at 25° C. for 600 seconds, and then rinsed with extra pure water.

The sample was subjected to Evaluation 1, and no corrosion was observed on the surface of the copper wiring material.

The sample having been subjected to the liquid contact treatment, similarly was then blown with nitrogen and subjected to Evaluation 2, and no foreign matter was observed on the surface of the copper wiring material.

For the evaluation of desorption of the adsorbed component as Evaluation 3, the sample having been subjected to the liquid contact treatment similarly was subjected to heat treatment at a reduced pressure of $1\times10^{-7}$ Pa and 250° C. for minutes, and then treatment with carbonated water, and was observed with SEM. Corrosion was observed on the surface of the copper wiring material, which confirmed desorption of the adsorbed component.

Comparative Example A-3

The substrate sample for evaluation was subjected to liquid contact treatment with a 1% by mass 2-methyl-3-butyn-2-ol aqueous solution at 25° C. for 120 seconds, and rinsed with extra pure water.

The sample was subjected to Evaluation 1, and no corrosion was observed on the surface of the copper wiring material.

The sample having been subjected to the liquid contact treatment similarly was subjected to Evaluation 2, and foreign matters were observed on the surface of the copper wiring material.

For the evaluation of desorption of the adsorbed component as Evaluation 3, the sample having been subjected to the liquid contact treatment similarly was dried by blowing nitrogen and subjected to heat treatment at a reduced pressure of $1\times10^{-7}$ Pa and 200° C. for 10 minutes, and then treatment with carbonated water, and was observed with SEM. Corrosion was observed on the surface of the copper wiring material, which confirmed desorption of the adsorbed component.

Comparative Example A-4

The substrate sample for evaluation was made in contact with 1% HF water at 25° C. for 60 seconds and then rinsed with extra pure water. Thereafter, the sample was immersed in a 0.1% by mass 1-octyn-3-ol aqueous solution at 25° C. for 120 seconds, and rinsed with extra pure water.

The sample was subjected to Evaluation 1, and no corrosion was observed on the surface of the copper wiring material.

The sample having been subjected to the liquid contact treatment similarly was blown with nitrogen and subjected to Evaluation 2, and foreign matters were observed on the surface of the copper wiring material.

For the evaluation of desorption of the adsorbed component as Evaluation 3, the sample having been subjected to the liquid contact treatment similarly was dried by blowing nitrogen and subjected to heat treatment at a reduced pressure of $1 \times 10^{-7}$ Pa and 200° C. for 10 minutes, and then treatment with carbonated water, and was observed with SEM. Corrosion was observed on the surface of the copper wiring material, which confirmed desorption of the adsorbed component.

Comparative Example A-5

The substrate sample for evaluation was subjected to liquid contact treatment with a 1% by mass 2,5-dimethyl-3-hexyn-2,5-diol aqueous solution at 25° C. for 120 seconds, and rinsed with extra pure water.

The sample was subjected to Evaluation 1, and corrosion was observed on the surface of the copper wiring material.

The sample having been subjected to the liquid contact treatment similarly was blown with nitrogen and subjected to Evaluation 2, and foreign matters were observed on the surface of the copper wiring material.

Evaluation 3 was not performed since no effect was obtained in Evaluation 1.

Comparative Example A-6

The substrate sample for evaluation was made in contact with HF water at 25° C. for 60 seconds and then rinsed with extra pure water. Thereafter, the sample was subjected to liquid contact treatment with a 0.1% by mass 5-methyl-1H-benzotriazole aqueous solution at 25° C. for 120 seconds, and rinsed with extra pure water.

The sample was subjected to Evaluation 1, and no corrosion was observed on the surface of the copper wiring material.

The sample having been subjected to the liquid contact treatment similarly was subjected to Evaluation 2, and foreign matters were observed on the surface of the copper wiring material.

For the evaluation of desorption of the adsorbed component as Evaluation 3, the sample having been subjected to the liquid contact treatment similarly was dried by blowing nitrogen and subjected to heat treatment at a reduced pressure of $1 \times 10^{-7}$ Pa and 200° C. for 10 minutes, and then treatment with carbonated water, and was observed with SEM. No corrosion was observed on the surface of the copper wiring material, and thus desorption of the adsorbed component was not confirmed.

Comparative Example A-7

The substrate sample for evaluation was subjected to liquid contact treatment with a supernatant of an aqueous solution containing extra pure water having adenine added thereto at 25° C. for 120 seconds, and rinsed with extra pure water.

The sample was subjected to Evaluation 1, and no corrosion was observed on the surface of the copper wiring material.

The sample having been subjected to the liquid contact treatment similarly was subjected to Evaluation 2, and foreign matters were observed on the surface of the copper wiring material.

For the evaluation of desorption of the adsorbed component as Evaluation 3, the sample having been subjected to the liquid contact treatment similarly was dried by blowing nitrogen and subjected to heat treatment at a reduced pressure of $1 \times 10^{-7}$ Pa and 200° C. for 10 minutes, and then treatment with carbonated water, and was observed with SEM. Corrosion was observed on the surface of the copper wiring material, which confirmed desorption of the adsorbed component.

Comparative Example A-8

The substrate sample for evaluation was made in contact with HF water at 25° C. for 60 seconds and then rinsed with extra pure water. Thereafter, the sample was subjected to liquid contact treatment with a 0.1% by mass mercaptosuccinic acid aqueous solution at 25° C. for 120 seconds, and rinsed with extra pure water.

The sample was subjected to Evaluation 1, and no corrosion was observed on the surface of the copper wiring material.

The sample having been subjected to the liquid contact treatment similarly was subjected to Evaluation 2, and no foreign matters was observed on the surface of the copper wiring material.

For the evaluation of desorption of the adsorbed component as Evaluation 3, the sample having been subjected to the liquid contact treatment similarly was dried by blowing nitrogen and subjected to heat treatment at a reduced pressure of $1 \times 10^{-7}$ Pa and 200° C. for 10 minutes, and then treatment with carbonated water, and was observed with SEM. No corrosion was observed on the surface of the copper wiring material, and thus desorption of the adsorbed component was not confirmed.

Comparative Example A-9

The substrate sample for evaluation was subjected to liquid contact treatment with an aqueous solution containing extra pure water having 0.5% by mass of 3,5-dimethyl-1-hexyn-3-ol added thereto at 25° C. for 120 seconds, and rinsed with extra pure water.

The sample was subjected to Evaluation 1, and no corrosion was observed on the surface of the copper wiring material.

The sample having been subjected to the liquid contact treatment similarly was subjected to Evaluation 2, and foreign matters were observed on the surface of the copper wiring material.

For the evaluation of desorption of the adsorbed component as Evaluation 3, the sample having been subjected to the liquid contact treatment similarly was dried by blowing nitrogen and subjected to heat treatment at a reduced pressure of $1 \times 10^{-7}$ Pa and 200° C. for 10 minutes, and then treatment with carbonated water, and was observed with SEM. Corrosion was observed on the surface of the copper wiring material, which confirmed desorption of the adsorbed component.

Comparative Example A-10

The substrate sample for evaluation was subjected to liquid contact treatment with a mixed aqueous solution of 0.005% by mass of 3-methyl-1-butyn-3-ol and 0.003% by mass of hydrazine at 25° C. for 30 seconds, and rinsed with extra pure water.

The sample was subjected to Evaluation 1, and corrosion was observed on the surface of the copper wiring material.

The sample having been subjected to the liquid contact treatment similarly was subjected to Evaluation 2, and foreign matters were observed on the surface of the copper wiring material.

Evaluation 3 was not performed since no effect was obtained in Evaluation 1.

Examples A-1 to A-7 and Comparative Examples A-1 to A-10 are shown in Tables 1 and 2. It is found from Tables 1 and 2 that in Examples A-1 to A-7 where the present invention is applied, excellent in protective effect of the surface of the copper wiring material is obtained, and the adsorbed component is easily removed from the surface of the copper wiring material.

In Examples A-1 to A-5, particularly, favorable results are obtained even when the specific resistance of the carbonated water in Evaluation 1 is 0.2 MΩ·cm, and favorable results are also obtained in Evaluations 2 and 3, as compared to Examples A-6 and A-7.

Example B

A substrate sample for evaluation was produced in the same manner as in Example A. Evaluation 1 and Evaluation 3 were performed by using the substrate sample for evaluation in the same manner as in Example A except that the conditions in Examples B-1 to B-11 and Comparative Examples B-1 to B-8 were employed.

Example B-1

The substrate sample for evaluation was subjected to liquid contact treatment with a mixed aqueous solution of 0.01% by mass of 3-phenyl-2-propyn-1-ol and 0.01% by mass of 1-octyn-3-ol at 25° C. for 120 seconds, and then rinsed with extra pure water.

The sample having been subjected to the liquid contact treatment was subjected to Evaluation 1, and no corrosion was observed on the surface of the copper wiring material.

TABLE 1

| | Removal of spontaneous oxide film | | Treatment with 3-phenyl-2-propyn-1-ol | | | Evaluation results | | | |
|---|---|---|---|---|---|---|---|---|---|
| Example | HF treatment | Rinsing | Concentration (% by mass) | Treating condition (° C./sec) | Rinsing | Evaluation 1 | Evaluation 2 | Evaluation 3 condition | Evaluation 3 |
| A-1 | no | none | 0.1 | 25/120 | extra pure water | A | A | ordinary pressure, argon, 200° C., 1 min | A |
| A-2 | done | extra pure water | 0.15 | 25/90 | extra pure water | A | A | 1 × 10$^{-7}$ Pa, 200° C., 10 min | A |
| A-3 | done | extra pure water | 0.03 | 25/600 | extra pure water | A | A | ordinary pressure, argon, 200° C., 10 min | A |
| A-4 | done | 3-phenyl-2-propyn-1-ol | 0.05 | 25/300 | extra pure water | A | A | 1 × 10$^{-7}$ Pa, 200° C., 10 min | A |
| A-5 | done | 3-phenyl-2-propyn-1-ol | 0.25 | 25/5 | none | A | A | 1 × 10$^{-7}$ Pa, 200° C., 10 min | A |
| A-6 | done | extra pure water | 0.01 | 25/300 | extra pure water | A | A | 1 × 10$^{-7}$ Pa, 200° C., 10 min | A |
| A-7 | no | none | 0.02 | 25/600 | extra pure water | A | A | 1 × 10$^{-7}$ Pa, 200° C., 10 min | A |

TABLE 2

| Comparative Example | Removal of spontaneous oxide film HF treatment | Treatment Component | Concentration (% by mass) | Treating condition (° C./sec) | Evaluation results | | | |
|---|---|---|---|---|---|---|---|---|
| | | | | | Evaluation 1 | Evaluation 2 | Evaluation 3 condition | Evaluation 3 |
| A-1 | no | — | — | — | B | B | — | — |
| A-2 | done | — | — | — | B | B | — | — |
| A-3 | no | 2-methyl-3-butyn-2-ol | 1.0 | 25/120 | A | B | 1 × 10$^{-7}$ Pa, 200° C., 10 min | A |
| A-4 | done | 1-octyn-3-ol | 0.1 | 25/120 | A | B | 1 × 10$^{-7}$ Pa, 200° C., 10 min | A |
| A-5 | no | 2,5-dimethyl-3-hexyn-2,5-diol | 1.0 | 25/120 | B | B | — | — |
| A-6 | done | 5-methyl-1H-benzotriazole | 0.1 | 25/120 | A | B | 1 × 10$^{-7}$ Pa, 200° C., 10 min | B |
| A-7 | no | adenine | supernatant | 25/120 | A | B | 1 × 10$^{-7}$ Pa, 200° C., 10 min | A |
| A-8 | done | mercaptosuccinic acid | 0.1 | 25/120 | A | A | 1 × 10$^{-7}$ Pa, 200° C., 10 min | B |
| A-9 | no | 3,5-dimethyl-1-hexyn-3-ol | 0.5 | 25/120 | A | B | 1 × 10$^{-7}$ Pa, 200° C., 10 min | A |
| A-10 | no | 0.005% by mass of 3-methyl-1-butyn-3-ol and 0.003% by mass of hydrazine | | 25/30 | B | B | — | — |

For the evaluation of desorption of the adsorbed component as Evaluation 3, the sample having been subjected to the liquid contact treatment similarly was dried by blowing nitrogen, and subjected to heat treatment at a reduced pressure of $1\times10^{-7}$ Pa and 300° C. for 10 minutes, and then treatment with carbonated water, and was observed with SEM. Corrosion was observed on the surface of the copper wiring material, which confirmed desorption of the adsorbed component.

Example B-2

The substrate sample for evaluation was made in contact with a hydrofluoric acid aqueous solution (hereinafter referred to as HF water) at 25° C. for 60 seconds for removing an oxide film on the surface of the copper wiring material, and then rinsed with extra pure water. Thereafter, the sample was dried by blowing nitrogen, and then subjected to liquid Contact treatment with a mixed aqueous solution of 0.02% by mass of 3-phenyl-2-propyn-1-ol and 0.05% by mass of 3,5-dimethyl-1-hexyn-3-ol at 25° C. for 90 seconds, and then rinsed with extra pure water.

The sample was subjected to Evaluation 1, and no corrosion was observed on the surface of the copper wiring material.

For the evaluation of desorption of the adsorbed component as Evaluation 3, the sample having been subjected to the liquid contact treatment similarly was dried by blowing nitrogen, and subjected to heat treatment at an ordinary pressure in an argon atmosphere at 200° C. for 5 minutes, and then treatment with carbonated water, and was observed with SEM. Corrosion was observed on the surface of the copper wiring material, which confirmed desorption of the adsorbed component.

Example B-3

The substrate sample for evaluation was made in contact with HF water at 25° C. for 60 seconds, and then rinsed with extra pure water. Thereafter, without blowing nitrogen, the sample was subjected to liquid contact treatment with a mixed aqueous solution of 0.03% by mass of 3-phenyl-2-propyn-1-ol and 0.1% by mass of 2,5-dimethyl-3-hexyn-2,5-diol at 25° C. for 120 seconds, and then rinsed with extra pure water.

The sample was subjected to Evaluation 1, and no corrosion was observed on the surface of the copper wiring material.

For the evaluation of desorption of the adsorbed component as Evaluation 3, the sample having been subjected to the liquid contact treatment similarly was dried by blowing nitrogen, and subjected to heat treatment at a reduced pressure of $1\times10^{-7}$ Pa and 200° C. for 10 minutes, and then treatment with carbonated water, and was observed with SEM. Corrosion was observed on the surface of the copper wiring material, which confirmed desorption of the adsorbed component.

Example B-4

The substrate sample for evaluation was subjected to liquid contact treatment with a mixed aqueous solution of 0.01% by mass of 3-phenyl-2-propyn-1-ol and 0.1% by mass of 1-ethynyl-1-cyclohexanol at 25° C. for 60 seconds, and then rinsed with extra pure water, followed by drying by blowing nitrogen.

The sample was subjected to Evaluation 1, and no corrosion was observed on the surface of the copper wiring material.

For the evaluation of desorption of the adsorbed component as Evaluation 3, the sample having been subjected to the liquid contact treatment similarly was subjected to heat treatment at an ordinary pressure in an argon atmosphere at 200° C. for 5 minutes, and then treatment with carbonated water, and was observed with SEM. Corrosion was observed on the surface of the copper wiring material, which confirmed desorption of the adsorbed component.

Example B-5

The substrate sample for evaluation was made in contact with HF water at 25° C. for 60 seconds, and then subjected to liquid contact treatment with a mixed aqueous solution of 0.005% by mass of 3-phenyl-2-propyn-1-ol and 0.1% by mass of 4-methyl-1-pentyn-3-ol at 25° C. for 120 seconds.

The sample was subjected to Evaluation 1, and no corrosion was observed on the surface of the copper wiring material.

For the evaluation of desorption of the adsorbed component as Evaluation 3, the sample having been subjected to the liquid contact treatment similarly was subjected to heat treatment at a reduced pressure of $1\times10^{-7}$ Pa and 400° C. for 5 minutes, and then treatment with carbonated water, and was observed with SEM. Corrosion was observed on the surface of the copper wiring material, which confirmed desorption of the adsorbed component.

Example B-6

The substrate sample for evaluation was made in contact with HF water at 25° C. for 60 seconds, and then subjected to liquid contact treatment with a mixed aqueous solution of 0.02% by mass of 3-phenyl-2-propyn-1-ol and 0.1% by mass of 4-pentyn-1-ol at 25° C. for 150 seconds.

The sample was subjected to Evaluation 1, and no corrosion was observed on the surface of the copper wiring material.

For the evaluation of desorption of the adsorbed component as Evaluation 3, the sample having been subjected to the liquid contact treatment similarly was subjected to heat treatment at a reduced pressure of $1\times10^{-7}$ Pa and 200° C. for 10 minutes, and then treatment with carbonated water, and was observed with SEM. Corrosion was observed on the surface of the copper wiring material, which confirmed desorption of the adsorbed component.

Example B-7

The substrate sample for evaluation was made in contact with HF water at 25° C. for 60 seconds, and then subjected to liquid contact treatment with a mixed aqueous solution of 0.025% by mass of 3-phenyl-2-propyn-1-ol and 0.1% by mass of 4-pentyn-2-ol at 25° C. for 180 seconds.

The sample was subjected to Evaluation 1, and no corrosion was observed on the surface of the copper wiring material.

For the evaluation of desorption of the adsorbed component as Evaluation 3, the sample having been subjected to the liquid contact treatment similarly was subjected to heat treatment at a reduced pressure of $1\times10^{-7}$ Pa and 200° C. for 10 minutes, and then treatment with carbonated water, and was observed with SEM. Corrosion was observed on the surface of the copper wiring material, which confirmed desorption of the adsorbed component.

Example B-8

The substrate sample for evaluation was subjected to liquid contact treatment with a mixed aqueous solution of 0.03% by mass of 3-phenyl-2-propyn-1-ol and 0.1% by mass of 2-methyl-3-butyn-2-ol at 25° C. for 120 seconds.

The sample was subjected to Evaluation 1, and no corrosion was observed on the surface of the copper wiring material.

For the evaluation of desorption of the adsorbed component as Evaluation 3, the sample having been subjected to the liquid contact treatment similarly was subjected to heat treatment at a reduced pressure of $1\times10^{-7}$ Pa and 200° C. for 10 minutes, and then treatment with carbonated water, and was observed with SEM. Corrosion was observed on the surface of the copper wiring material, which confirmed desorption of the adsorbed component.

Example B-9

The substrate sample for evaluation was subjected to liquid contact treatment with a mixed aqueous solution of 0.01% by mass of 3-phenyl-2-propyn-1-ol and 0.1% by mass of 3-methyl-1-pentyn-3-ol at 25° C. for 120 seconds.

The sample was subjected to Evaluation 1, and no corrosion was observed on the surface of the copper wiring material.

For the evaluation of desorption of the adsorbed component as Evaluation 3, the sample having been subjected to the liquid contact treatment similarly was subjected to heat treatment at a reduced pressure of $1\times10^{-7}$ Pa and 250° C. for 10 minutes, and then treatment with carbonated water, and was observed with SEM. Corrosion was observed on the surface of the copper wiring material, which confirmed desorption of the adsorbed component.

Example B-10

The substrate sample for evaluation was made in contact with HF water at 25° C. for 60 seconds, and then subjected to liquid contact treatment with a mixed aqueous solution of 0.025% by mass of 3-phenyl-2-propyn-1-ol and 0.075% by mass of a polyoxyethylene compound, a 10 mol ethylene oxide adduct of 2,4,7,9-tetramethyl-5-decyn-4,7-diol, at 25° C. for 120 seconds.

The sample was subjected to Evaluation 1, and no corrosion was observed on the surface of the copper wiring material.

For the evaluation of desorption of the adsorbed component as Evaluation 3, the sample having been subjected to the liquid contact treatment similarly was subjected to heat treatment at a reduced pressure of $1\times10^{-7}$ Pa and 400° C. for 10 minutes, and then treatment with carbonated water, and was observed with SEM. Corrosion was observed on the surface of the copper wiring material, which confirmed desorption of the adsorbed component.

Example B-11

The substrate sample for evaluation was subjected to liquid contact treatment with a mixed aqueous solution of 0.02% by mass of 3-phenyl-2-propyn-1-ol and 0.05% by mass of a polyoxyethylene compound, a 10 mol ethylene oxide adduct of 2,5,8,11-tetramethyl-6-dodecyn-5,8-diol, at 25° C. for 120 seconds.

The sample was subjected to Evaluation 1, and no corrosion was observed on the surface of the copper wiring material.

For the evaluation of desorption of the adsorbed component as Evaluation 3, the sample having been subjected to the liquid contact treatment similarly was subjected to heat treatment at a reduced pressure of $1\times10^{-7}$ Pa and 400° C. for 10 minutes, and then treatment with carbonated water, and was observed with SEM. Corrosion was observed on the surface of the copper wiring material, which confirmed desorption of the adsorbed component.

Comparative Example B-1

The substrate sample for evaluation was subjected to Evaluation 1 without subjecting to the treatment with HF water (liquid contact) for removing an oxide film on the surface of the copper wiring material and the liquid contact treatment, and corrosion was observed on the copper wiring material.

Evaluation 3 was not performed since no effect was obtained in Evaluation 1.

Comparative Example B-2

The substrate sample for evaluation was made in contact with HF water at 25° C. for 60 seconds for removing an oxide film on the surface of the copper wiring material, and rinsed with extra pure water, followed by drying by blowing nitrogen.

The sample was subjected to Evaluation 1, and corrosion was observed on the copper wiring material.

Evaluation 3 was not performed since no effect was obtained in Evaluation 1.

Comparative Example B-3

The substrate sample for evaluation was made in contact with HF water at 25° C. for 60 seconds, and then rinsed with extra pure water. Thereafter, the sample was subjected to liquid contact treatment with a mixed aqueous solution of 0.01% by mass of 3-phenyl-2-propyn-1-ol and 1% by mass of urea at 25° C. for 180 seconds, and then rinsed with extra pure water.

The sample was subjected to Evaluation 1, and no corrosion was observed on the copper wiring material.

For the evaluation of desorption of the adsorbed component as Evaluation 3, the sample having been subjected to the liquid contact treatment similarly was subjected to heat treatment at an ordinary pressure in an argon atmosphere at 100° C. for 5 minutes, and then treatment with carbonated water, and was observed with SEM. No corrosion was observed on the surface of the copper wiring material, and thus desorption of the adsorbed component was not confirmed.

Comparative Example B-4

The substrate sample for evaluation was subjected to liquid contact treatment with a mixed aqueous solution of 0.02% by mass of 3-phenyl-2-propyn-1-ol and 1% by mass of iminodiacetic acid at 25° C. for 120 seconds, and then rinsed with extra pure water.

The sample was subjected to Evaluation 1, and no corrosion was observed on the surface of the copper wiring material.

For the evaluation of desorption of the adsorbed component as Evaluation 3, the sample having been subjected to the liquid contact treatment similarly was dried by blowing nitrogen, and subjected to heat treatment at a reduced pressure of $1\times10^{-7}$ Pa and 200° C. for 10 minutes, and then treatment with carbonated water, and was observed with SEM. No corrosion was observed on the surface of the copper wiring material, and thus desorption of the adsorbed component was not confirmed.

Comparative Example B-5

The substrate sample for evaluation was made in contact with HF water at 25° C. for 60 seconds, and then rinsed with extra pure water. Thereafter, the sample was subjected to liquid contact treatment with a mixed aqueous solution of 0.01% by mass of 3-phenyl-2-propyn-1-ol and 0.01% by mass of D-α-tocopherol at 25° C. for 120 seconds, and then rinsed with extra pure water.

The sample was subjected to Evaluation 1, and no corrosion was observed on the surface of the copper wiring material.

For the evaluation of desorption of the adsorbed component as Evaluation 3, the sample having been subjected to the liquid contact treatment similarly was dried by blowing nitrogen, and subjected to heat treatment at a reduced pressure of $1 \times 10^{-7}$ Pa and 200° C. for 10 minutes, and then treatment with carbonated water, and was observed with SEM. No corrosion was observed on the surface of the copper wiring material, and thus desorption of the adsorbed component was not confirmed.

Comparative Example B-6

The substrate sample for evaluation was subjected to liquid contact treatment with a mixed aqueous solution of 0.02% by mass of 3-phenyl-2-propyn-1-ol and 0.1% by mass of 5-methyl-1H-benzotriazole at 25° C. for 120 seconds, and then rinsed with extra pure water.

The sample was subjected to Evaluation 1, and no corrosion was observed on the surface of the copper wiring material.

For the evaluation of desorption of the adsorbed component as Evaluation 3, the sample having been subjected to the liquid contact treatment similarly was dried by blowing nitrogen, and subjected to heat treatment at a reduced pressure of $1 \times 10^{-7}$ Pa and 200° C. for 10 minutes, and then treatment with carbonated water, and was observed with SEM. No corrosion was observed on the surface of the copper wiring material, and thus desorption of the adsorbed component was not confirmed.

Comparative Example B-7

The substrate sample for evaluation was made in contact with HF water at 25° C. for 60 seconds, and then rinsed with extra pure water. Thereafter, the sample was subjected to liquid contact treatment with a mixed aqueous solution of 0.01% by mass of 3-phenyl-2-propyn-1-ol and 0.1% by mass of mercaptosuccinic acid solution at 25° C. for 120 seconds, and then rinsed with extra pure water.

The sample was subjected to Evaluation 1, and no corrosion was observed on the surface of the copper wiring material.

For the evaluation of desorption of the adsorbed component as Evaluation 3, the sample having been subjected to the liquid contact treatment similarly was dried by blowing nitrogen, and subjected to heat treatment at a reduced pressure of $1 \times 10^{-7}$ Pa and 200° C. for 10 minutes, and then treatment with carbonated water, and was observed with SEM. No corrosion was observed on the surface of the copper wiring material, and thus desorption of the adsorbed component was not confirmed.

Examples 3-1 to B-11 and Comparative Examples 3-1 to B-7 are shown in Tables 3 and 4. It is found from Tables 3 and 4 that in Examples B-1 to B-11 where the present invention is applied, excellent in protective effect of the surface of the copper wiring material is obtained, and the adsorbed component is easily removed from the surface of the copper wiring material.

TABLE 3

| Example | Removal of sponlaneous oxide film HF treatment | Treatment Component | Treatment condition (° C./sec) | Evaluation results Evaluation 1 | Evaluation 3 condition | Evaluation 3 |
|---|---|---|---|---|---|---|
| B-1 | no | 0.01% by mass of 3-phenyl-2-propyn-1-ol 0.01% by mass of 1-octyn-3-ol | 25/120 | A | $1 \times 10^{-7}$ Pa, 300° C., 10 min | A |
| B-2 | done | 0.02% by mass of 3-phenyl-2-propyn-1-ol 0.05% by mass of 3,5-dimethyl-1-hexyn-3-ol | 25/90 | A | ordinary pressure, argon, 200° C., 5 min | A |
| B-3 | done | 0.03% by mass of 3-phenyl-2-propyn-1-ol 0.1% by mass of 2,5-dimethyl-3-hexyn-2,5-ol | 25/120 | A | $1 \times 10^{-7}$ Pa, 200° C., 10 min | A |
| B-4 | no | 0.01% by mass of 3-phenyl-2-propyn-1-ol 0.1% by mass of 1-ethynyl-1-cyclohexanol | 25/90 | A | ordinary pressure, argon, 200° C., 5 min | A |
| B-5 | done | 0.005% by mass of 3-phenyl-2-propyn-1-ol 0.1% by mass of 4-methyl-1-pentyn-3-ol | 25/120 | A | $1 \times 10^{-7}$ Pa, 400° C., 5 min | A |
| B-6 | done | 0.02% by mass of 3-phenyl-2-propyn-1-ol 0.1% by mass of 4-pentyn-1-ol | 25/150 | A | $1 \times 10^{-7}$ Pa, 200° C., 10 min | A |
| B-7 | done | 0.025% by mass of 3-phenyl-2-propyn-1-ol 0.1% by mass of 4-pentyn-2-ol | 25/180 | A | $1 \times 10^{-7}$ Pa, 200° C., 10 min | A |
| B-8 | no | 0.03% by mass of 3-phenyl-2-propyn-1-ol 0.1% by mass of 2-methyl-3-butyn-2-ol | 25/120 | A | $1 \times 10^{-7}$ Pa, 200° C., 10 min | A |
| B-9 | no | 0.01% by mass of 3-phenyl-2-propyn-1-ol 0.1% by mass of 3-methyl-1-pentyn-3-ol | 25/120 | A | $1 \times 10^{-7}$ Pa, 250° C., 10 min | A |
| B-10 | done | 0.025% by mass of 3-phenyl-2-propyn-1-ol 0.075% by mass of 10 mol ethylene oxide adduct of 2,4,7,9-tetramethyl-5-dicyn-4,7-diol | 25/120 | A | $1 \times 10^{-7}$ Pa, 400° C., 10 min | A |
| B-11 | no | 0.02% by mass of 3-phenyl-2-propyn-1-ol 0.05% by mass of 10 mol ethylene oxide adduct of 2,5,8,11-tetramethyl-6-dedocyn-5,8-diol | 25/120 | A | $1 \times 10^{-7}$ Pa, 400° C., 10 min | A |

TABLE 4

| Comparative Example | Removal of spontaneous oxide film HF treatment | Treatment Component | Treatment condition (° C./sec) | Evaluation 1 | Evaluation 3 condition | Evaluation 3 |
|---|---|---|---|---|---|---|
| B-1 | no | — | — | B | — | — |
| B-2 | done | — | — | B | — | — |
| B-3 | done | 0.01% by mass of 3-phenyl-2-propyn-1-ol 1% by mass of urea | 25/180 | B | ordinary pressure, argon, 100° C., 5 min | B |
| B-4 | no | 0.02% by mass of 3-phenyl-2-propyn-1-ol 1% by mass of iminodiacetic acid | 25/120 | B | $1 \times 10^{-7}$ Pa, 200° C., 10 min | B |
| B-5 | done | 0.01% by mass of 3-phenyl-2-propyn-1-ol 0.01% by mass of D-α-tocopherol | 25/120 | B | $1 \times 10^{-7}$ Pa, 200° C., 10 min | B |
| B-6 | no | 0.02% by mass of 3-phenyl-2-propyn-1-ol 0.1% by mass of 5-methyl-1H-benzotriazole | 25/120 | A | $1 \times 10^{-7}$ Pa, 200° C., 10 min | B |
| B-7 | done | 0.01% by mass of 3-phenyl-2-propyn-1-ol 0.1% by mass of mercaptosuccinic acid | 25/120 | A | $1 \times 10^{-7}$ Pa, 200° C., 10 min | B |

The invention claimed is:

1. A copper wiring material surface protective liquid used in production of a semiconductor circuit device containing copper wiring, consisting of an aqueous solvent and an acetylene alcohol compound containing at least 3-phenyl-2-propyn-1-ol.

2. The copper wiring material surface protective liquid according to claim 1, wherein the acetylene alcohol compound is 3-phenyl-2-propyn-1-ol, and the protective liquid contains the same in an amount of from 0.01 to 0.25% by mass.

3. The copper wiring material surface protective liquid according to claim 2, wherein the protective liquid contains 3-phenyl-2-propyn-1-ol in an amount of from 0.03 to 0.25% by mass.

4. The copper wiring material surface protective liquid according to claim 1, wherein the acetylene alcohol compound contains two or more kinds of compounds including 3-phenyl-2-propyn-1-ol, and the protective liquid contains 3-phenyl-2-propyn-1-ol in an amount of from 0.001 to 0.03% by mass.

5. The copper wiring material surface protective liquid according to claim 4, wherein the at least one kind of the acetylene alcohol compound other than 3-phenyl-2-propyn-1-ol is an acetylene alcohol having from 3 to 10 carbon atoms.

6. The copper wiring material surface protective liquid according to claim 4, wherein the at least one kind of the acetylene alcohol compound other than 3-phenyl-2-propyn-1-ol is a polyoxyalkylene compound of an acetylenediol.

7. The copper wiring material surface protective liquid according to claim 6, wherein the acetylenediol is 2,4,7,9-tetramethyl-5-decyn-4,7-diol or 2,5,8,11-tetramethyl-6-dodecyn-5,8-diol.

8. The copper wiring material surface protective liquid according to claim 4, wherein a concentration of the acetylene alcohol compound other than 3-phenyl-2-propyn-1-ol is from 0.001 to 10% by mass.

9. A method for producing a semiconductor circuit device, comprising: forming an insulating film and/or a diffusion preventing film on a silicon substrate; then forming a copper film by a sputtering; then forming a copper film or a copper alloy film containing 80% by mass or more of copper thereon by a plating method; and flattening the film by a chemical mechanical polishing (CMP) method, thereby providing a semiconductor substrate containing a flattened copper wiring, the semiconductor substrate having an exposed surface of a copper wiring material being treated by making in contact with the copper wiring material surface protective liquid according to claim 1.

* * * * *